(12) United States Patent
Fukami

(10) Patent No.: US 11,971,042 B2
(45) Date of Patent: Apr. 30, 2024

(54) VACUUM PUMP AND CONTROL DEVICE FOR VACUUM PUMP

(71) Applicant: Edwards Japan Limited, Yachiyo (JP)

(72) Inventor: Hideo Fukami, Yachiyo (JP)

(73) Assignee: Edwards Japan Limited, Yachiyo (JP)

( * ) Notice: Subject to any disclaimer, the term of this patent is extended or adjusted under 35 U.S.C. 154(b) by 264 days.

(21) Appl. No.: 17/423,397

(22) PCT Filed: Jan. 27, 2020

(86) PCT No.: PCT/JP2020/002745
§ 371 (c)(1),
(2) Date: Jul. 15, 2021

(87) PCT Pub. No.: WO2020/158658
PCT Pub. Date: Aug. 6, 2020

(65) Prior Publication Data
US 2022/0074421 A1 Mar. 10, 2022

(30) Foreign Application Priority Data

Feb. 1, 2019 (JP) ................ 2019-017117

(51) Int. Cl.
*F04D 27/00* (2006.01)
*F04D 19/04* (2006.01)
(Continued)

(52) U.S. Cl.
CPC ......... *F04D 27/001* (2013.01); *F04D 19/042* (2013.01); *F04D 19/048* (2013.01);
(Continued)

(58) Field of Classification Search
CPC .. F04D 27/001; F04D 19/042; F04D 25/0633; F04D 19/048; G01K 13/00;
(Continued)

(56) References Cited

U.S. PATENT DOCUMENTS

| 6,542,853 B1 * | 4/2003 | Murakami | G07C 3/00 |
| | | | 702/33 |
| 9,037,281 B2 | 5/2015 | Pyotsia et al. | |

(Continued)

FOREIGN PATENT DOCUMENTS

| JP | H11211622 A | 8/1999 |
| JP | 2009074512 A | 4/2009 |
| JP | 2018003615 A | 1/2018 |

OTHER PUBLICATIONS

Extended Search Report from counterpart European Application No. 20748915.4 dated Sep. 29, 2022, 8 pp.
(Continued)

*Primary Examiner* — Phutthiwat Wongwian
*Assistant Examiner* — Susan E Scharpf
(74) *Attorney, Agent, or Firm* — Shumaker & Sieffert, P.A.

(57) ABSTRACT

A vacuum pump and a control device are capable of accurately determining timing of rotor blade replacement by creating an index which allows a degree of fatigue of a rotor blade to be determined quantitatively and easily. A motor current value output from a motor drive control portion is input to a time count processing portion, and time in which a current value of a rotating body remains in a range of a stage is totalized for each stage of the current value in the time count processing portion. A rotor blade temperature value output from a rotor blade temperature measurement portion is also input to the time count processing portion. A one-minute average value of the rotor blade temperature value acquired by sampling is calculated. For each stage of the rotor blade temperature value, time in which the average value remains in a range of the stage is totalized.

5 Claims, 7 Drawing Sheets

(51) Int. Cl.
| | |
|---|---|
| *F04D 25/06* | (2006.01) |
| *G01K 13/00* | (2021.01) |
| *G01R 19/165* | (2006.01) |
| *G05B 23/02* | (2006.01) |
| *G08B 21/18* | (2006.01) |

(52) U.S. Cl.
CPC ......... *F04D 25/0633* (2013.01); *G01K 13/00* (2013.01); *G01R 19/16533* (2013.01); *G05B 23/0235* (2013.01); *G08B 21/182* (2013.01); *F05D 2270/3032* (2013.01); *F05D 2270/335* (2013.01); *G05B 23/0283* (2013.01)

(58) Field of Classification Search
CPC ............ G01R 19/16533; G08B 21/182; G05B 23/0283; G05B 23/0235; F05D 2270/3032; F05D 2270/335
See application file for complete search history.

(56) References Cited

U.S. PATENT DOCUMENTS

| | | | | |
|---|---|---|---|---|
| 10,474,143 | B2* | 11/2019 | Kozaki | G01L 1/18 |
| 10,718,703 | B2* | 7/2020 | Pariseau | G01N 15/1459 |
| 2002/0018727 | A1* | 2/2002 | Yamauchi | F04D 29/584 |
| | | | | 417/313 |
| 2002/0039533 | A1* | 4/2002 | Miyamoto | F04D 29/584 |
| | | | | 417/313 |
| 2002/0090309 | A1* | 7/2002 | Yamashita | F04D 19/04 |
| | | | | 417/423.4 |
| 2002/0108569 | A1* | 8/2002 | Yamauchi | F04D 19/04 |
| | | | | 118/724 |
| 2003/0175112 | A1* | 9/2003 | Namiki | F04D 25/16 |
| | | | | 415/90 |
| 2017/0371330 | A1* | 12/2017 | Kozaki | G01K 13/08 |

OTHER PUBLICATIONS

Translation and Original International Search Report from counterpart International Application No. PCT/JP2020/002745 dated Mar. 24, 2020, 9 pp.

\* cited by examiner

VACUUM PUMP AND CONTROL DEVICE FOR VACUUM PUMP

This application is a U.S. national phase application under 35 U.S.C. § 371 of international application number PCT/JP2020/002745 filed on Jan. 27, 2020, which claims the benefit of priority to JP application number 2019-017117 filed on Feb. 1, 2019. The entire contents of each of international application number PCT/JP2020/002745 and JP application number 2019-017117 are incorporated herein by reference.

TECHNICAL FIELD

The present disclosure relates to a vacuum pump and a control device for a vacuum pump, and particularly relates to a vacuum pump and a control device for a vacuum pump which are capable of accurately determining timing of rotor blade replacement by creating an index which allows especially a degree of fatigue of a rotor blade to be determined quantitatively and easily.

BACKGROUND

With development of electronics in recent years, demand for semiconductors such as a memory and an integrated circuit is sharply growing.

These semiconductors are manufactured by doping a semiconductor substrate having extremely high purity with an impurity to impart electrical properties to the semiconductor substrate or forming a fine circuit on a semiconductor substrate by etching.

These operations need to be carried out in a chamber in a high vacuum state in order to avoid an influence caused by dust and the like in the air. In general, vacuum pumps are used in order to exhaust air from the chamber and, among them, a turbo-molecular pump, which is one of the vacuum pumps, is used frequently due to a small amount of residual gas and easy maintenance.

In addition, manufacturing steps of a semiconductor include many steps in which various process gases are caused to act on a semiconductor substrate, and the turbo-molecular pump is used not only to evacuate the chamber but also to exhaust these process gases from the chamber.

Incidentally, there are cases where process gases are introduced into the chamber in a state in which the process gases are heated to a high temperature in order to increase reactivity.

In addition, there are cases where, when these process gases are cooled to a given temperature when the process gases are exhausted, the process gases become solid and a product is deposited in an exhaust system. Further, there are cases where the process gas of this type is cooled to a low temperature and becomes solid in the turbo-molecular pump, and is adhered to and deposited in an internal portion of the turbo-molecular pump.

When a product of the process gas is deposited in the internal portion of the turbo-molecular pump, this deposit narrows a pump flow path and causes performance of the turbo-molecular pump to be reduced.

In order to solve this problem, conventionally, a heater or an annular water jacket pipe is wound around an outer periphery of a base portion or the like of the turbo-molecular pump, a temperature sensor is embedded in, e.g., the base portion, and control of heating by the heater or cooling by the water jacket pipe is performed based on a signal of the temperature sensor such that a temperature of the base portion is maintained at high temperatures in a specific range (see Japanese Patent Application Publication No. 2002-257079, Japanese Patent No. 5782378, and WO 2010/021307A1).

The product is less likely to be deposited as the controlled temperature is higher, and hence it is desirable to raise the temperature as high as possible.

On the other hand, when the temperature of the base portion is raised to a high temperature, in the case where an exhaust load fluctuates or an ambient temperature is changed to a high temperature, a temperature of a rotor blade may exceed a limit temperature.

In order to prevent such a harmful effect, for example, a radiation thermometer is installed in the base portion to constantly measure the temperature of the rotor blade, an alarm is issued in the case where the pump is operated in a state in which the temperature exceeds a predetermined threshold for a specific time period, and the pump is stopped when the pump is continuously operated for, e.g., 30 seconds in a state in which the temperature is further exceeded.

Once the pump is operated in these operations, the operation of the pump is continued for, e.g., one to five years and, except during overhaul maintenance of the pump, there are few opportunities to stop the pump.

Consequently, necessity to replace a rotor blade is usually determined when the overhaul maintenance of the turbo-molecular pump is performed. In the determination, in addition to damage and discoloration which can be visually determined, cumulative operation time of the pump recorded in a control circuit is used as a determination item.

SUMMARY

However, even in the case of rotor blades having the same cumulative operation time, stress acting on the rotor blade differs depending on a gas load during an operation, and hence there are cases where degrees of fatigue of the rotor blades are significantly different from each other. In addition, temperature during the operation is not negligible, and the higher the temperature during the operation is, the higher the degree of fatigue of the rotor blade is.

Information on the cumulative operation time of the pump recorded in the control circuit does not include information on the gas load and the temperature, and hence it is not possible to determine necessity to replace the rotor blade with high accuracy.

As a result, a manufacturer recommends early replacement with emphasis placed on safety, but it is not easy to convince customers of the necessity thereto.

In addition, the above-mentioned determination items may not be enough to determine the degree of fatigue of the rotor blade properly. For example, if there is a situation where the temperature becomes higher and lower than a threshold temperature repeatedly within 30 seconds, although the situation is not detected as a pump abnormality, a considerable level of fatigue may be accumulated in the rotor blade.

Further, when sampling from the temperature sensor is performed, e.g., every 0.5 seconds, an amount of this temperature data obtained by continuously accumulating the temperature data during the operation of one to five years is enormous. In the case where the temperature data having this data amount is analyzed, a load required for the analysis is extremely significant. Accordingly, it is desired to perform the analysis of the degree of fatigue of the rotor blade in a state in which an extreme load is not applied to a CPU embedded in the control circuit.

Consequently, it is desired to create, in addition to the cumulative operation time, an index which allows the degree of fatigue of the rotor blade to be determined quantitatively and easily.

The present disclosure has been made in view of the above conventional problem, and an object thereof is to provide a vacuum pump and a control device for a vacuum pump which are capable of accurately determining timing of rotor blade replacement by creating an index which allows a degree of fatigue of a rotor blade to be determined quantitatively and easily.

To attain the above object, in some examples, the present disclosure describes a vacuum pump capable of determining timing of rotor blade replacement, the vacuum pump including: a rotor blade which is provided in a vacuum pump main body; a sensor which is disposed in the vacuum pump main body and measures a physical quantity related to the rotor blade; a physical quantity extraction means for extracting the physical quantity which is measured by the sensor during an operation of the vacuum pump; a setting means for setting, in advance, a fluctuation range of the physical quantity extracted by the physical quantity extraction means to a plurality of stages; a time acquisition means for acquiring total time of each of the plurality of stages when the physical quantity belongs to the stage during the operation of the vacuum pump and total time of all of the stages; a storage means for storing the total time of each stage and the total time of all of the stages which are acquired by the time acquisition means; and a display means for displaying the total time of each stage stored by the storage means or displaying a ratio of the total time of each stage to the total time of all of the stages.

The physical quantity related to the rotor blade measured by the sensor is extracted. In the setting means, the fluctuation range of the physical quantity is set to the plurality of stages in advance. Subsequently, the total time of each of the plurality of stages when the physical quantity belongs to the stage and the total time of all of the stages are acquired. The acquired total time of each stage and the ratio of the total time of each stage to the total time of all of the stages are displayed.

With this, by using only a few numerical values such as the totalized time of each stage of the physical quantity or the ratio of the totalized time of each stage, it is possible to determine necessity to replace the rotor blade objectively and accurately. In addition, this numerical value can also be used as a guideline for an amount of a deposit of process gas deposited in an internal portion of the vacuum pump.

In addition, in some examples, the present disclosure describes the vacuum pump further including: a comparison means for comparing the total time of each stage acquired by the time acquisition means with a predetermined threshold; and an alarm generation means for issuing an alarm based on a comparison result in the comparison means.

It is possible to determine whether or not an overhaul is necessary from a cumulative value of counted time, and provide a notification that the overhaul of the rotor blade is necessary. Thus, by providing notification of an alarm indicating that the overhaul is necessary, it can be expected that a rotating body damage accident will be prevented.

Further, according to some examples of the present disclosure, the sensor is a temperature measurement means for measuring a temperature of the rotor blade provided in the vacuum pump main body, or a current amount measurement means for measuring a current amount of a current flowing through a motor which drives the rotor blade.

The temperature measurement means and the current amount measurement means are used in protection function processing of the pump. In addition to their use as this protection function, it is possible to use the temperature measurement means and the current amount measurement means in determination of timing of the overhaul of the rotor blade.

Further, in some examples, the present disclosure describes a control device for a vacuum pump having a rotor blade which is provided in a vacuum pump main body and a sensor which is disposed in the vacuum pump main body and measures a physical quantity related to the rotor blade, the control device including: a physical quantity extraction means for extracting the physical quantity which is measured by the sensor during an operation of the vacuum pump; a setting means for setting, in advance, a fluctuation range of the physical quantity extracted by the physical quantity extraction means to a plurality of stages; a time acquisition means for acquiring total time of each of the plurality of stages when the physical quantity belongs to the stage during the operation of the vacuum pump and total time of all of the stages; a storage means for storing the total time of each stage and the total time of all of the stages which are acquired by the time acquisition means; and a display means for displaying the total time of each stage stored by the storage means or displaying a ratio of the total time of each stage to the total time of all of the stages, the control device being capable of determining timing of replacement of the rotor blade based on the total time of each stage or the ratio of the total time of each stage to the total time of all of the stages which is displayed by the display means.

As described thus far, according to some examples of the present disclosure, the time acquisition means for acquiring the total time of each stage when the physical quantity belongs to the stage during the operation of the vacuum pump and the total time of all of the stages is provided, and the total time of each stage or the ratio of the total time of each stage to the total time of all of the stages is displayed, and hence it is possible to determine the necessity to replace the rotor blade objectively and accurately by using only a few numerical values such as the totalized time of each stage of the physical quantity or the ratio of the totalized time of each stage. In addition, this numerical value can also be used as the guideline for the amount of the deposit of the process gas deposited in the internal portion of the vacuum pump.

DETAILED DESCRIPTION

Figure 1:
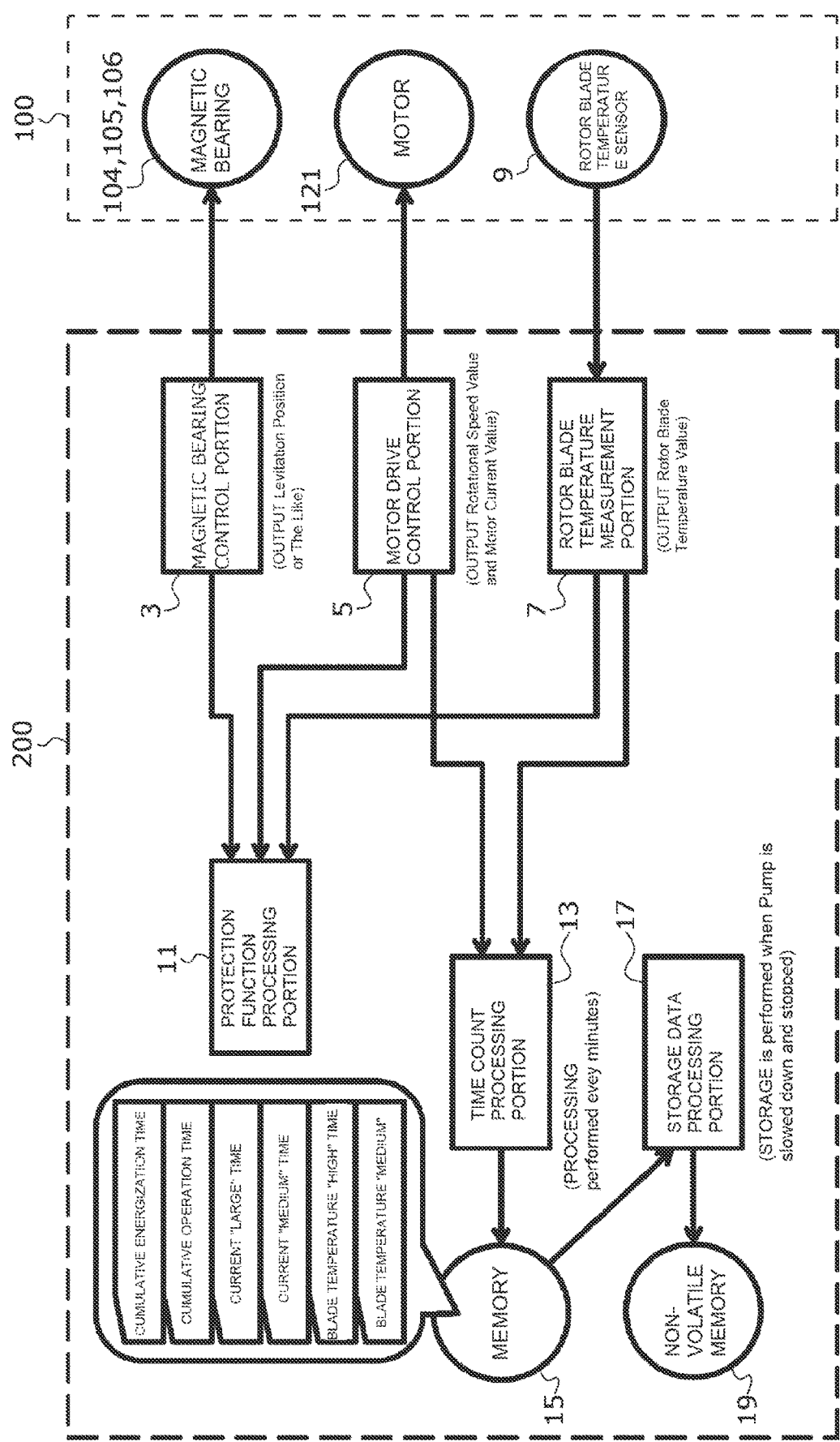
FIG. 1 is a system configuration diagram related to determination of necessity to replace a rotor blade in an embodiment of the present disclosure.
Figure 2:
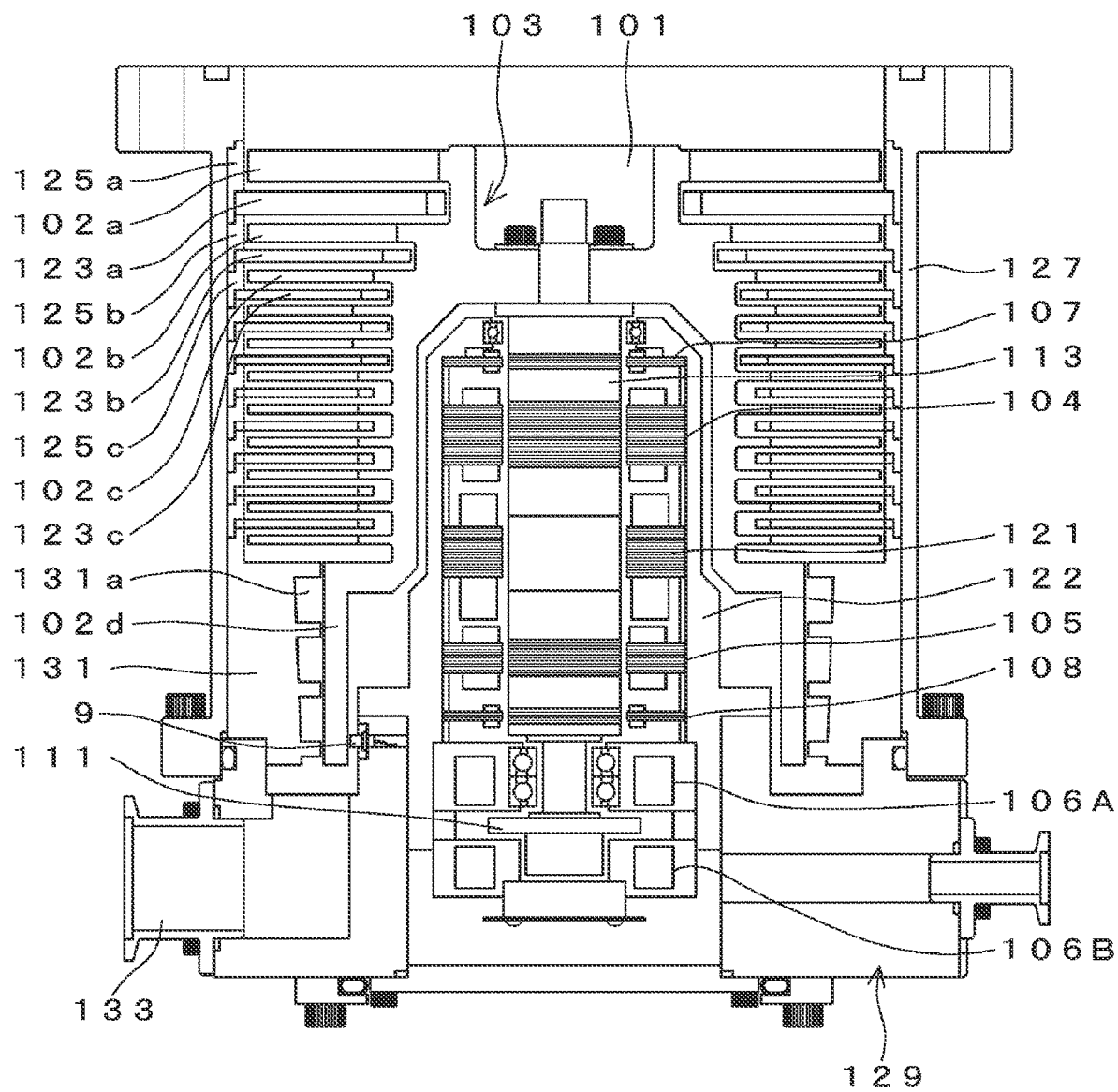
FIG. 2 is a configuration diagram of a turbo-molecular pump.

Hereinbelow, an embodiment of the present disclosure will be described. FIG. 1 shows a system configuration diagram related to determination of necessity to replace a rotor blade in the embodiment of the present disclosure, and FIG. 2 shows a configuration diagram of a turbo-molecular pump.

In FIG. 1, a control device 200 is shown as a device separate from a pump main body 100, but the present embodiment can be applied to the turbo-molecular pump even when the pump main body 100 and the control device 200 are integrated with each other.

In the control device 200, there are disposed a magnetic bearing control portion 3 which performs levitation control of magnetic bearings (104, 105, 106) provided in the pump main body 100, and a motor drive control portion 5 which performs rotational control of a motor 121. A rotor blade temperature measurement portion 7 receives a signal obtained by measuring a temperature of a rotating body 103 with a rotor blade temperature sensor 9 in a noncontact manner. A levitation position of the rotating body 103 or the like is output from the magnetic bearing control portion 3, and is input to a protection function processing portion 11. In the protection function processing portion 11, when an abnormality occurs in the levitation position of the rotating body 103 or the like, an alarm is issued or a pump is stopped.

A rotational speed value of the rotating body 103 and a motor current value are output from the motor drive control portion 5, and are input to the protection function processing portion 11. In the protection function processing portion 11, when an abnormality occurs in the rotational speed value of the rotating body 103 or the motor current value, an alarm is issued or the pump is stopped. The motor current value output from the motor drive control portion 5 is input to a time count processing portion 13 and, for each stage of the current value, time in which the current value of the rotating body 103 remains in a range of the stage is totalized in the time count processing portion 13.

A rotor blade temperature value is output from the rotor blade temperature measurement portion 7, and is input to the protection function processing portion 11. In the protection function processing portion 11, when an abnormality occurs in the rotor blade temperature value, an alarm is issued or the pump is stopped. The rotor blade temperature value output from the rotor blade temperature measurement portion 7 is input to the time count processing portion 13. A one-minute average value of the rotor blade temperature value acquired by sampling is calculated. Thereafter, for each stage of the rotor blade temperature value, time in which the average value remains in a range of the stage is totalized.

Subsequently, each time value calculated by totalization in the time count processing portion 13 is stored in a memory 15. In a storage data processing portion 17, data is read from the memory 15, e.g., when the pump is slowed down and stopped or every two hours, and is stored in a non-volatile memory 19.

In FIG. 2, at an upper end of a cylindrical outer tube 127 of the pump main body 100, an inlet port 101 is formed. Inside the outer tube 127, there is provided the rotating body 103 having a plurality of rotor blades 102a, 102b, 102c, . . . which are constituted by turbine blades for sacking and exhausting gas and are radially formed in multi-layers on a peripheral portion of the rotating body 103.

A rotor shaft 113 is mounted to the center of the rotating body 103, and the rotor shaft 113 is levitated in the air and supported by what is called five-axis controlled magnetic bearings, and is subjected to position control.

In an upper radial electromagnet 104, four electromagnets are disposed in pairs along an X axis and a Y axis which are coordinate axes in a radial direction of the rotor shaft 113 and are orthogonal to each other. An upper radial sensor 107 including four electromagnets is provided so as to be close to and correspond to the upper radial electromagnet 104. The upper radial sensor 107 detects a radial displacement of the rotor shaft 113, and sends the detected radial displacement to the control device 200.

In the magnetic bearing control portion 3 of the control device 200, energization of the upper radial electromagnet 104 is controlled via a compensation circuit having a PID adjustment function based on a displacement signal detected by the upper radial sensor 107, and an upper radial position of the rotor shaft 113 is thereby adjusted.

The rotor shaft 113 is formed of a high-permeability material (iron or the like), and is attracted by magnetic force of the upper radial electromagnet 104. Such adjustments are performed in an X-axis direction and a Y-axis direction independently of each other.

In addition, a lower radial electromagnet 105 and a lower radial sensor 108 are disposed similarly to the upper radial electromagnet 104 and the upper radial sensor 107, and a lower radial position of the rotor shaft 113 is adjusted by the magnetic bearing control portion 3 similarly to the adjustment of the upper radial position.

Further, axial electromagnets 106A and 106B are disposed such that a disc-shaped metal disc 111 provided below the rotor shaft 113 is vertically sandwiched between the axial electromagnets 106A and 106B. The metal disc 111 is formed of a high-permeability material such as iron. An axial sensor which is not shown is provided to detect an axial displacement of the rotor shaft 113, and its axial displacement signal is sent to the magnetic bearing control portion 3 of the control device 200.

Energization of the axial electromagnets 106A and 106B is controlled via the compensation circuit having the PID adjustment function of the magnetic bearing control portion 3 based on the axial displacement signal. The axial electromagnet 106A and the axial electromagnet 106B attract the metal disc 111 upward and downward by magnetic force.

Thus, in the magnetic bearing control portion 3 of the control device 200, each of the axial electromagnets 106A and 106B appropriately adjusts the magnetic force exerted on the metal disc 111 to magnetically levitate the rotor shaft 113 in an axial direction and hold the rotor shaft 113 in space in a noncontact manner.

The motor 121 includes a plurality of magnetic poles which are circularly disposed so as to surround the rotor shaft 113. Each magnetic pole is controlled by the motor drive control portion 5 so as to rotationally drive the rotor shaft 113 via electromagnetic force which acts between the magnetic pole and the rotor shaft 113.

A plurality of stator blades 123a, 123b, 123c . . . are disposed so as to form small gaps between the plurality of stator blades 123a, 123b, 123c . . . and the rotor blades 102a, 102b, 102c, . . . . Each of the rotor blades 102a, 102b, 102c . . . transfers molecules of exhaust gas downward using collision, and hence each of the rotor blades 102a, 102b, 102c . . . is formed so as to be inclined by a predetermined angle with respect to a plane perpendicular to an axis of the rotor shaft 113.

In addition, similarly, the stator blades 123 are also formed so as to be inclined by a predetermined angle with respect to the plane perpendicular to the axis of the rotor shaft 113, and are disposed toward an inner side of the outer tube 127 such that tiers of the stator blades 123 alternate with tiers of the rotor blades 102.

One ends of the stator blades 123 are supported in a state in which one ends of the stator blades 123 are inserted between a plurality of stator blade spacers 125a, 125b, 125c . . . which are stacked on each other.

The stator blade spacer 125 is an annular member, and is formed of a metal such as, e.g., aluminum, iron, stainless steel, copper, or alloys containing these metals as components.

The outer tube 127 is fixed to an outer periphery of the stator blade spacer 125 with a small gap formed between the outer periphery thereof and the outer tube 127. A base portion 129 is disposed at a bottom portion of the outer tube 127, and a threaded spacer 131 is disposed between a portion below the stator blade spacer 125 and the base portion 129. An outlet port 133 is formed below the threaded spacer 131 in the base portion 129, and is caused to communicate with the outside.

The threaded spacer 131 is a cylindrical member formed of a metal such as aluminum, copper, stainless steel, iron, or alloys containing these metals as components, and a plurality of spiral thread grooves 131a are formed in an inner peripheral surface of the threaded spacer 131.

A spiral direction of the thread groove 131a is a direction in which, when molecules of the exhaust gas move in a rotation direction of the rotating body 103, the molecules are transferred toward the outlet port 133.

In a lowest portion of the rotating body 103 below the rotor blades 102a, 102b, 102c . . . , a cylindrical portion 102d is suspended. An outer peripheral surface of the cylindrical portion 102d is cylindrical and is protruded toward an inner peripheral surface of the threaded spacer 131, and is positioned close to the inner peripheral surface of the threaded spacer 131 with a predetermined gap formed between the outer peripheral surface of the cylindrical portion 102d and the inner peripheral surface of the threaded spacer 131.

The base portion 129 is a disc-shaped member constituting a foot portion of the pump main body 100 of the turbo-molecular pump, and is typically formed of a metal such as iron, aluminum, or stainless steel.

The base portion 129 physically holds the pump main body 100 and also has a function as a heat conduction path, and hence it is desirable to use, as a material of the base portion 129, a metal having rigidity and high heat conductivity such as iron, aluminum, or copper.

In such a configuration, when the rotor blade 102 is driven by the motor 121 and rotates together with the rotor shaft 113, exhaust gas from a chamber is sucked through the inlet port 101 by actions of the rotor blade 102 and the stator blade 123.

The exhaust gas sucked from the inlet port 101 passes between the rotor blade 102 and the stator blade 123, and is transferred to the base portion 129. At this point, a temperature of the rotor blade 102 increases due to frictional heat generated when the exhaust gas comes into contact with or collides with the rotor blade 102, or conduction or radiation of heat generated in the motor 121, and this heat is transmitted to a side of the stator blade 123 by radiation or conduction by molecules of the exhaust gas or the like.

Outer peripheral surfaces of the stator blade spacers 125 are joined to each other, and the stator blade spacer 125 transmits heat received by the stator blade 123 from the rotor blade 102 and frictional heat generated when the exhaust gas comes into contact with or collides with the stator blade 123 to the outer tube 127 and the threaded spacer 131.

The exhaust gas transferred to the threaded spacer 131 is sent to the outlet port 133 while being guided by the thread groove 131a.

In addition, an electrical component portion is covered with a stator column 122 such that gas sucked from the inlet port 101 does not enter a side of the electrical component portion constituted by the motor 121, the lower radial electromagnet 105, the lower radial sensor 108, the upper radial electromagnet 104, and the upper radial sensor 107, and pressure in the electrical component portion is maintained at a predetermined pressure by using purge gas.

The rotor blade temperature sensor 9 is installed in an outer diameter portion of the stator column 122 and in the vicinity of the outlet port 133.

Next, operations of the present embodiment will be described.

In the present embodiment, there is provided cumulative operation time information for creating an index of determination of rotor blade replacement. As the cumulative operation time information, time which satisfies a specific condition is defined, and its cumulative time is recorded. Specifically, conditions are set for the following two items.

(1) With regard to a current value of a current supplied to the motor 121 which allows determination of a tendency of a gas load, cumulative time in which the current value is more than a given prescribed value is recorded.

(2) With regard to a temperature value of the rotor blade 102 which is used for abnormality detection, cumulative time in which the temperature value is more than a given prescribed value is recorded.

Note that, in recent semiconductor process equipment, the turbo-molecular pump is used with a complicated recipe, and hence, in order to indicate a tendency of a use situation, the above-described prescribed values are set to a plurality of stages and a cumulative value of time in which the prescribed value remains in each stage is recorded.

For example, as a level of the current value of the current supplied to the motor 121, three stages including large/medium/small stages are set in descending order of the current value. Herein, the number of stages consisting of large/medium/small stages is three for descriptive convenience, and it is desirable to have more stages. This applies to setting of the rotor blade temperature value described later.

"Large" is a range of the current value in which the current value is large and which includes an alarm level and an abnormality level and is not expected to be used in a normal operation. A condition for alarm generation or an operation stop of the pump is continuation of a state in which a prescribed current value is exceeded for, e.g., 30 seconds. Accordingly, the alarm is not issued or the pump is not stopped in the case where time in which the current value remains at the alarm level or the abnormality level is short such as several seconds but, when such a situation is repeated and the time is accumulated due to application of an extremely large load, it is assumed that fatigue of the rotor blade 102 is caused. As an index of a degree of fatigue of the rotor blade 102, it is possible to use cumulative time in which the current value is in "large".

"Medium" is a range of the current value which denotes a normal operation situation as the pump and is expected to be used in an operation. The range of the current value which is expected to be used in the operation is determined for each pump. "Small" denotes a situation where a load is small, or the motor 121 is not rotated though the rotating body 103 is magnetically levitated. In the case where the cumulative value of the time in which the current value remains in each stage is recorded, when it is assumed that the cumulative operation time is 100%, it is possible to determine that the pump having a record of, e.g., [large 10%/medium 70%/small 20%] has been used in an operation situation where fluctuation of the gas load is small and the load is not very large. On the other hand, it is possible to determine that the pump having a record of [large 50%/medium 40%/small 10%] has been used in an operation situation where the fluctuation of the gas load is large and the load is large.

If the cumulative operation time of the former is equal to the cumulative operation time of the latter, it is possible to determine that the latter is the pump having a high degree of fatigue of the rotor blade 102. Even in the case where the cumulative operation time of the former is different from the cumulative operation time of the latter, cumulative time in which the pump is used at a supplied current level "large" is recorded, and hence it is possible to determine the degree of fatigue from the value of the cumulative time.

Note that, in the case of the rotor blade temperature value, similarly, it is possible to determine the degree of fatigue of the rotor blade 102 by setting a temperature range which does not cause abnormality detection to three levels consisting of high/medium/low stages, and recording the cumulative value of time in which the rotor blade temperature value remains in each stage.

Next, the operations of the present embodiment will be described based on a flowchart.

Figure 3:
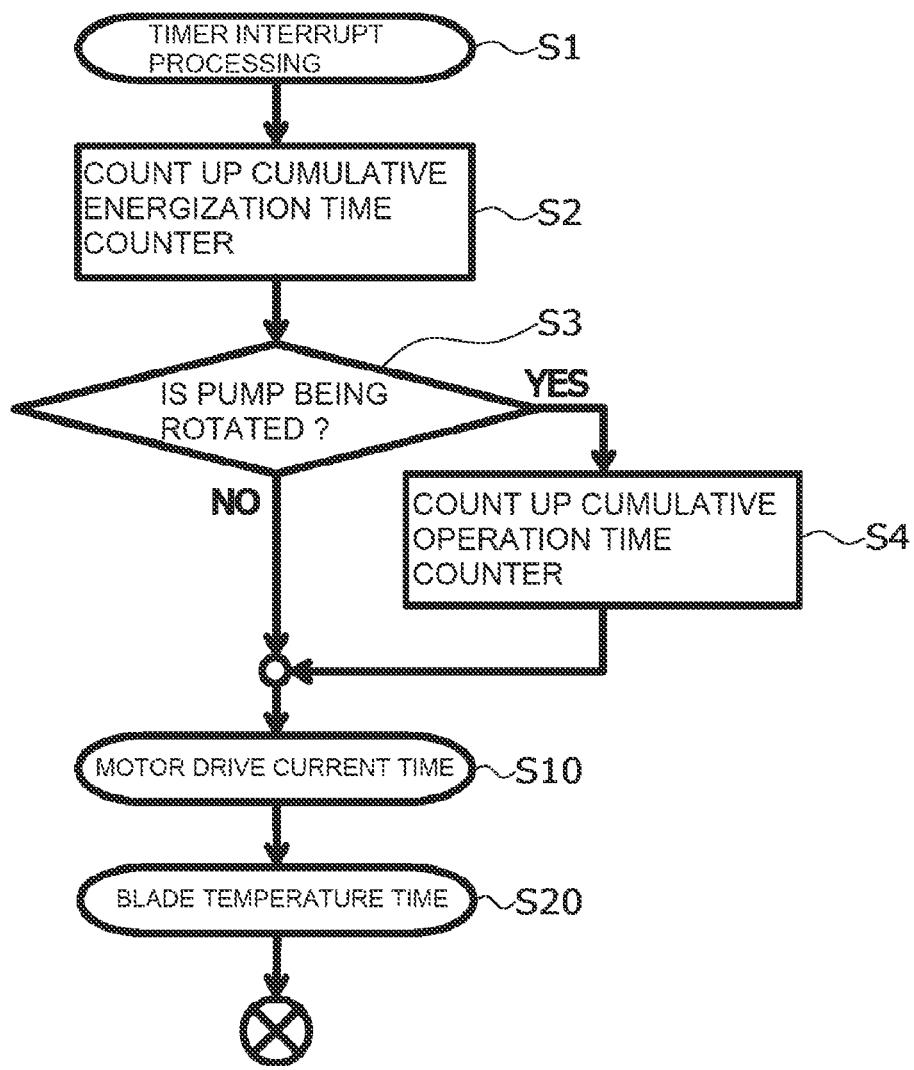
FIG. 3 is a flowchart of the determination of necessity to replace the rotor blade in the present embodiment.

FIG. 3 shows a flowchart of determination of necessity to replace the rotor blade in the present embodiment. The flowchart is executed in the time count processing portion 13. The time count processing portion 13 corresponds to a time acquisition means.

In FIG. 3, in Step 1 (abbreviated as S1 in the drawing. The same applies to the following description), a timer interrupt is performed, e.g., every minute, and steps of processing in and after Step 2 are performed. In Step 2, a cumulative energization time counter is counted up. The counting-up operation is performed by increasing a numerical value of the cumulative energization time counter by one (hereinafter referred to as incrementing) (the same applies to the following description). The cumulative energization time counter counts energization time in a state in which a control power supply is turned ON, and counts the energization time even in a state in which the rotor blade 102 is not rotated and is levitated and supported by the magnetic bearing control portion 3. A value obtained by multiplying a count number of the energization time by timer interrupt time corresponds to total time of all stages. In Step 3, it is determined whether or not the pump is being rotated and, when it is determined that the pump is being rotated, the processing proceeds to Step 4, and a cumulative operation time counter is counted up.

On the other hand, when it is determined that the pump is not being rotated in Step 3, the processing proceeds to a motor drive current time sub-routine in Step 10, and totalized time of a motor drive current of each stage is measured. Thereafter, the processing proceeds to a blade temperature time sub-routine in Step 20, and totalized time of the blade temperature of each stage is measured. Each of the totalized time of the motor drive current of each stage and the totalized time of the blade temperature of each stage corresponds to total time when a physical quantity belongs to each stage.

Figure 4:
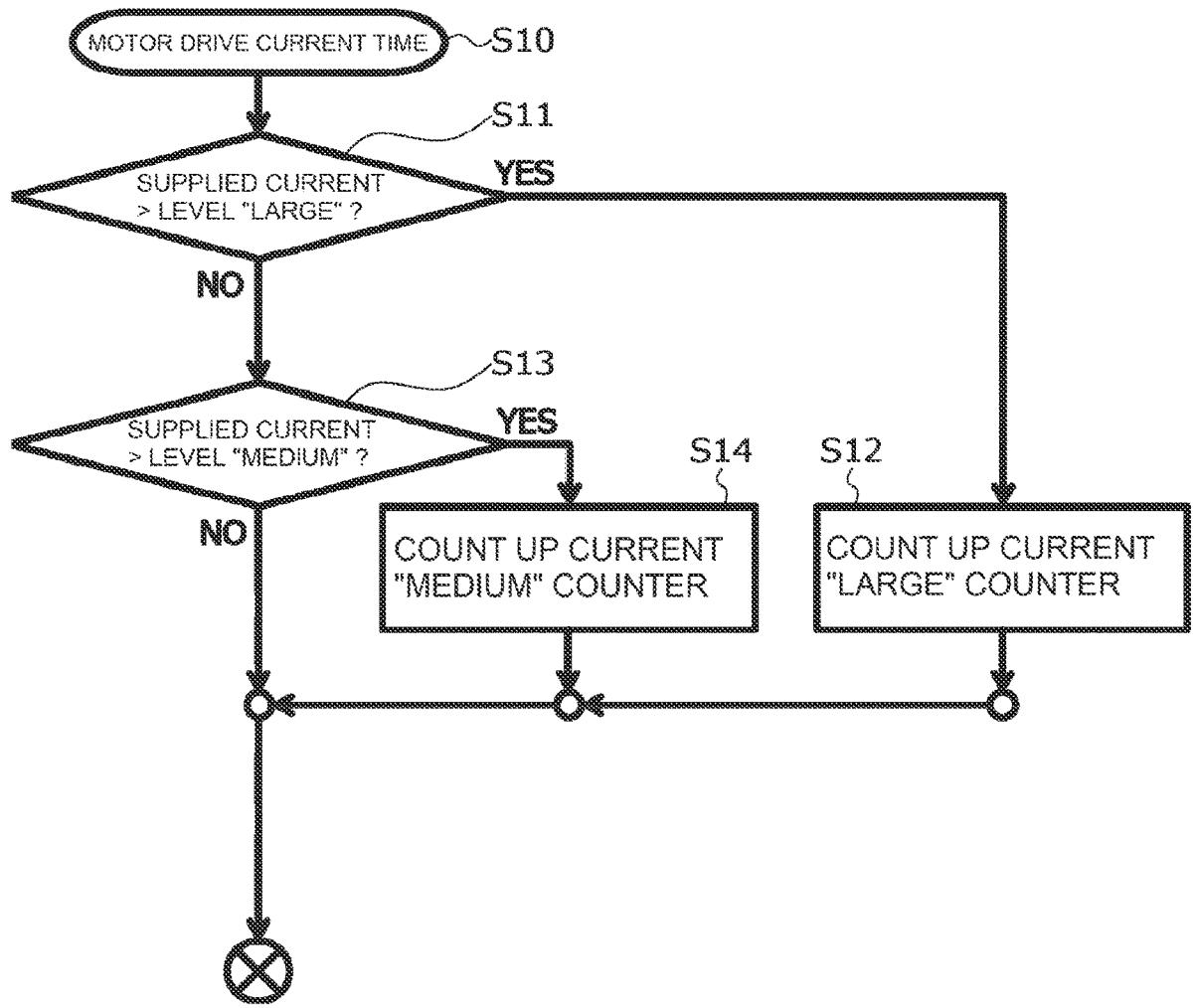
FIG. 4 shows a motor drive current time sub-routine.

The motor drive current time sub-routine in FIG. 4 will be described.

In Step 11, it is determined whether or not the motor current value output from the motor drive control portion 5 is more than a preset level "large". In the case where the motor current value is more than the level "large", the processing proceeds to Step 12, a current "large" counter is counted up, and the processing then proceeds to Step 20. On the other hand, when the motor current value is not more than the preset level "large" in Step 11, the processing proceeds to Step 13, and it is determined whether or not the motor current value is more than a preset level "medium". Subsequently, when the motor current value is more than the level "medium", the processing proceeds to Step 14, a current "medium" counter is counted up, and the processing then proceeds to Step 20. On the other hand, when the motor current value is not more than the preset level "medium" in Step 13, the processing proceeds to Step 20.

Counting of a current "small" is not performed because a count value of the current "small" is obtained by subtracting a count value of the current "large" counter and a count value of the current "medium" counter from a count value of the cumulative energization time counter.

With this, every minute, it is determined which one of the stages consisting of the current "large", the current "medium", and the current "small" the measured motor current value is in, and totalization is performed by performing incrementing on the corresponding stage.

It is possible to calculate the totalized time by multiplying the count value by one minute. This time data is displayed for each stage. In addition, a ratio of the time totalized for each stage may be calculated and displayed with the assumption that the total time of all of the stages is expressed as 100%.

With this, it is possible to determine necessity to replace the rotor blade 102 objectively and accurately by using only three numerical values which are the totalized times or the ratios of the current "large", the current "medium", and the current "small". In addition, these numerical values can also be used as guidelines for an amount of a deposit of process gas deposited in an internal portion of the turbo-molecular pump.

Next, the blade temperature time sub-routine in FIG. 5 will be described.

In Step 21, it is determined whether or not the rotor blade temperature value output from the rotor blade temperature measurement portion 7 is higher than a temperature value of a preset level "high". In the case where the rotor blade temperature value is higher than the temperature value of the level "high", the processing proceeds to Step 22, and a blade temperature "high" counter is counted up. Thereafter, the processing proceeds to Step 30, and this timer interrupt processing is ended. On the other hand, when the rotor blade temperature value is not higher than the temperature value of the preset level "high" in Step 21, the processing proceeds to Step 23, and it is determined whether or not the rotor blade temperature value is higher than a temperature value of a preset level "medium". Subsequently, in the case where the rotor blade temperature value is higher than the temperature value of the level "medium", the processing proceeds to Step 24, and a blade temperature "medium" counter is counted up. Thereafter, the processing proceeds to Step 30, and this timer interrupt processing is ended. On the other hand, when the rotor blade temperature value is not higher than the temperature value of the preset level "medium" in Step 23, the processing proceeds to Step 30, and the timer interrupt processing is ended.

Counting of a blade temperature "low" is not performed because a count value of the blade temperature "low" is obtained by subtracting a count value of the blade temperature "high" counter and a count value of the blade temperature "medium" counter from the count value of the cumulative energization time counter.

With this, every minute, it is determined which one of the stages consisting of the blade temperature "high", the blade temperature "medium", and the blade temperature "low" the measured rotor blade temperature value is in, and totalization is performed by performing incrementing on the corresponding stage.

Consequently, similarly to the case of the motor current value, it is possible to determine necessity to replace the rotor blade 102 objectively and accurately by using only three numerical values which are the totalized times or the ratios of the blade temperature "high", the blade temperature "medium", and the blade temperature "low". In addition, these pieces of data can also be used as information for convincing customers.

Figure 5:
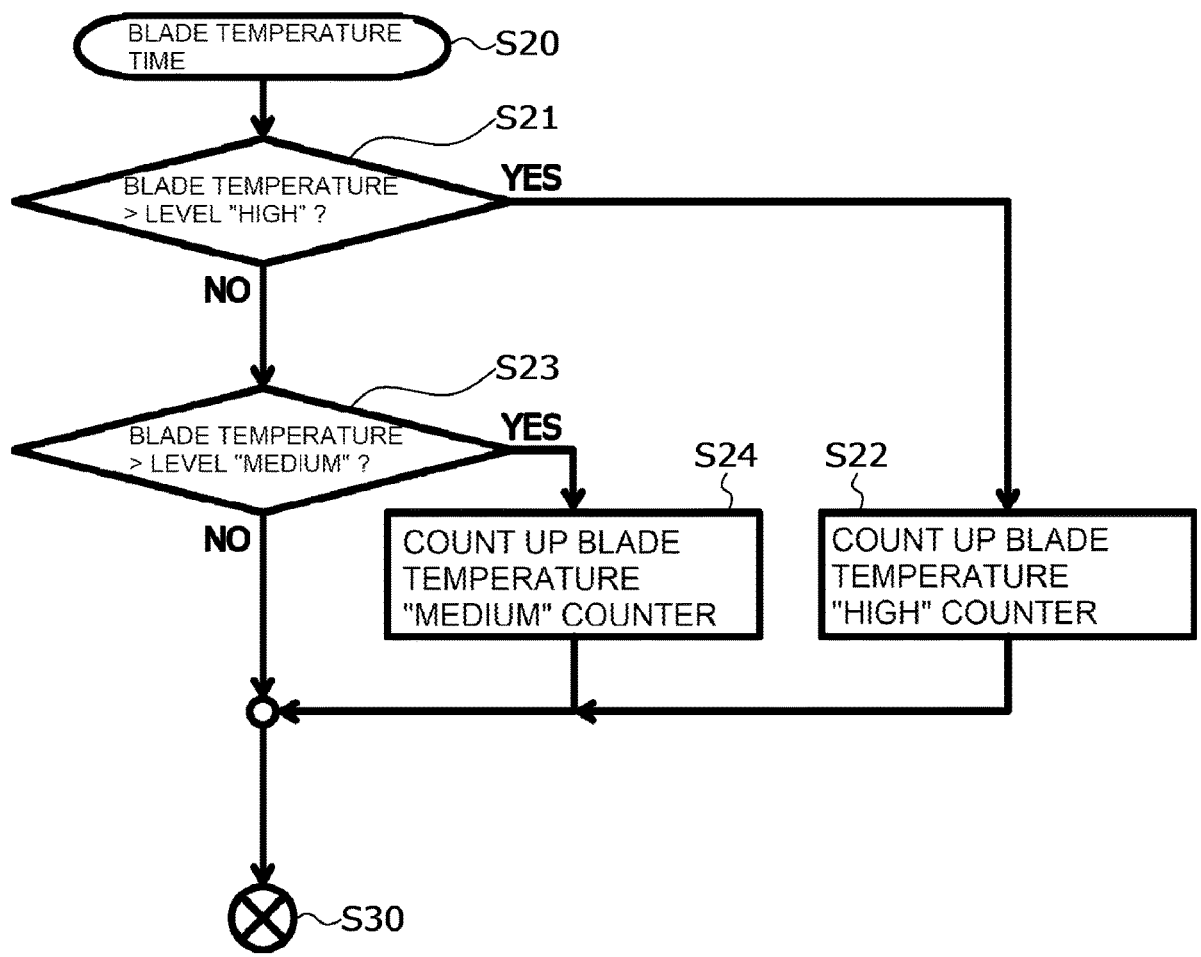
FIG. 5 shows a blade temperature time sub-routine.
Figure 6:
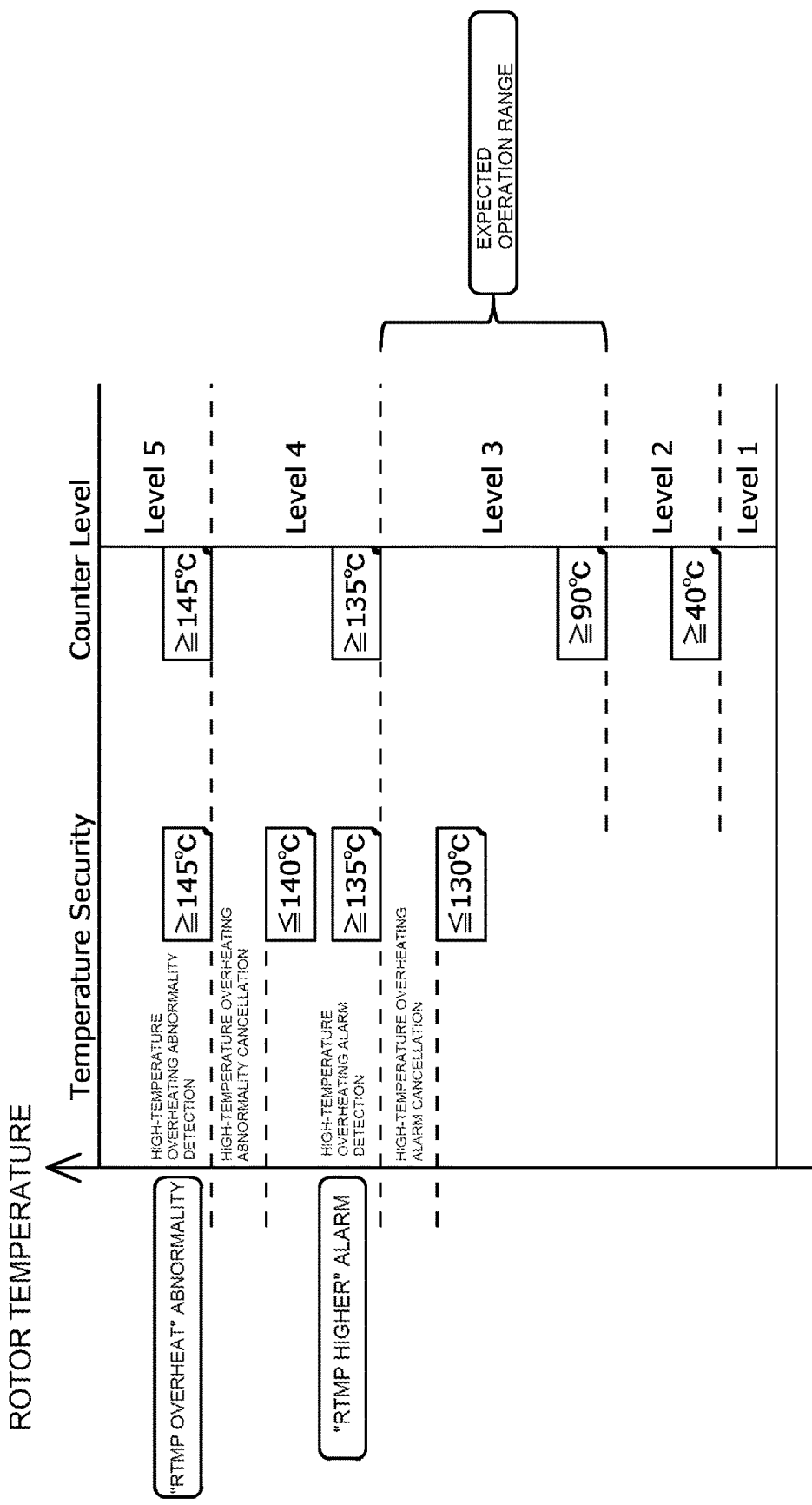
FIG. 6 shows an example in which a rotor blade temperature value has five stages.

The blade temperature time sub-routine in FIG. 5 has been described by using the rotor blade temperature values in three stages, and FIG. 6 shows an example in which the rotor blade temperature value has five stages.

In FIG. 6, with regard to the rotor blade temperature value, it is assumed that a temperature of high-temperature overheating alarm detection is set to, e.g., 135° C. An alarm is issued when this temperature is reached. Alarm cancellation of this alarm is set to 130° C. to cope with hysteresis. In addition, it is assumed that a temperature of high-temperature overheating abnormality detection is set to, e.g., 145° C. When this temperature is reached, a pump stop command is issued after this state lasts for, e.g., 30 seconds. This abnormality cancellation is set to 140° C. to cope with hysteresis.

Herein, with regard to a level of a blade temperature counter, five stages are prepared so as to meet a temperature value which is set for safety control of the rotor blade 102. That is, a range from the temperature of the high-temperature overheating alarm detection 135° C. to the temperature of the high-temperature overheating abnormality detection 145° C. is set as Level 4, and a range equal to or higher than the temperature of the high-temperature overheating abnormality detection 145° C. is set as Level 5. Note that a range of the rotor blade temperature value of not less than 90° C. and less than 135° C. is set as Level 3 because this temperature range is an operation range which is expected to be used in a pump operation. In addition, a range of the rotor blade temperature value of not less than 40° C. and less than 90° C. is set as Level 2 because this temperature range is a range of an operation situation where a large load is not applied during an operation and an extra load can be born. Further, a range of the rotor blade temperature value of less than 40° C. is set as Level 1 because the rotor blade 102 does not rotate and is magnetically levitated in this temperature range.

Thus, by setting the rotor blade temperature value to five stages, it is possible to determine necessity to replace the rotor blade 102 more objectively and accurately. With regard to this point, it is possible to perform further objective and accurate determination by increasing the number of stages.

Figure 7:
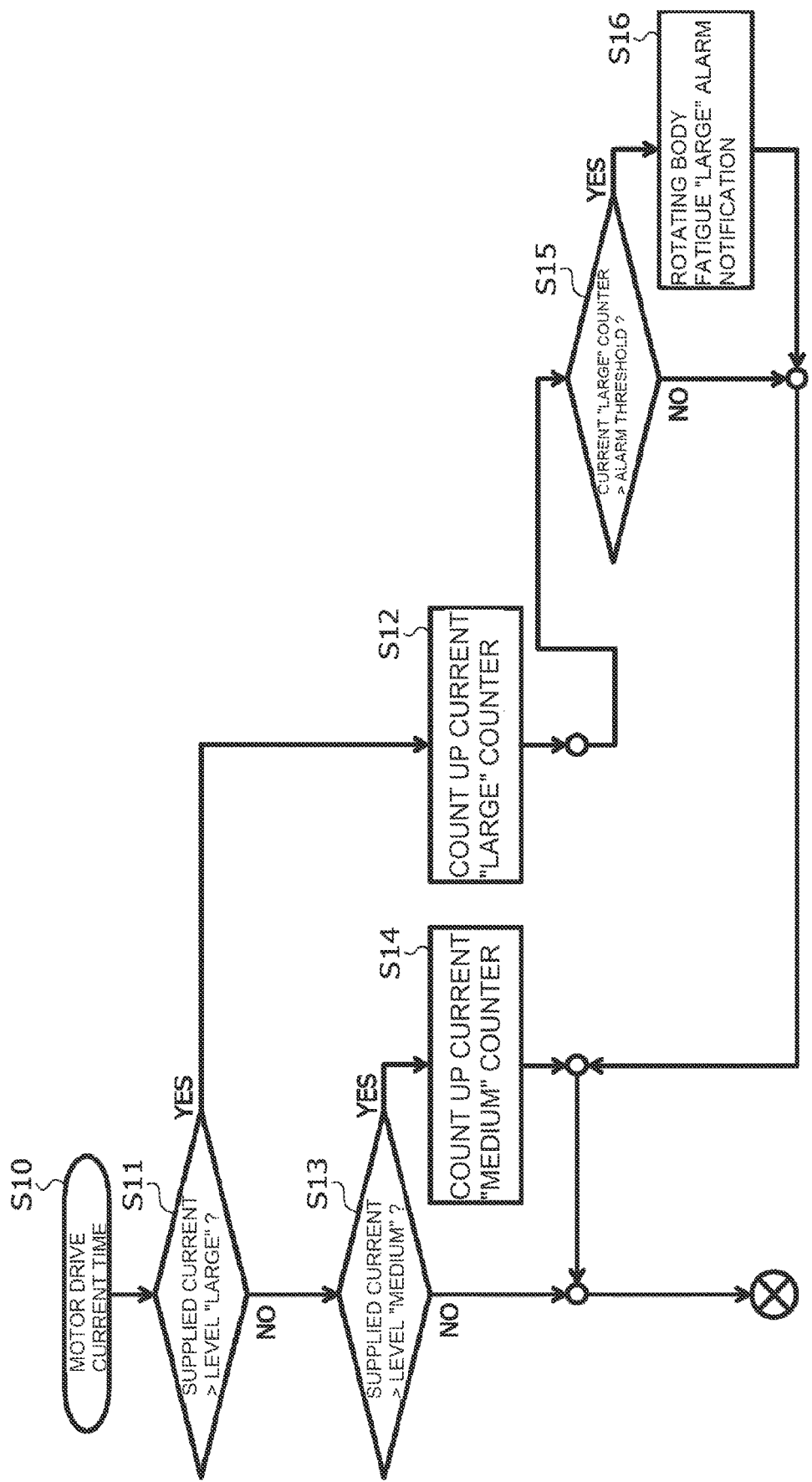
FIG. 7 is a flowchart showing a method of providing notification of an alarm indicating that an overhaul is necessary.

Next, a method of providing notification of an alarm indicating that an overhaul is necessary will be described based on FIG. 7. Note that elements identical to those in FIG. 4 are designated by the same reference numerals, and the description thereof will be omitted. In FIG. 7, after the current "large" counter is counted up in Step 12, the method proceeds to Step 15. In Step 15, it is determined whether or not the count value of the current "large" counter is more than a preset alarm threshold. In the case where the count value is more than the alarm threshold, a rotating body fatigue "large" alarm notification is issued in Step 16.

With this, every minute, it is possible to determine whether or not the overhaul is necessary from the count value of the current "large" counter and provide a notification that the overhaul is necessary. Thus, by providing notification of the alarm indicating that the overhaul is necessary, it can be expected that a rotating body damage accident will be prevented.

The present disclosure can be variously modified without departing from the spirit of the present disclosure, and it should be understood that the present disclosure encompasses the modifications.

What is claimed is:

1. A vacuum pump capable of determining timing of rotor blade replacement, the vacuum pump comprising:
   a rotor blade which is provided in a vacuum pump main body;
   at least two sensors disposed in the vacuum pump main body and configured to measure physical quantities related to the rotor blade, wherein a first sensor of the at least two sensors is a temperature measurement means for measuring a temperature of the rotor blade and a second sensor of the at least two sensors is a current amount measurement means for measuring a current amount of an electrical current flowing through a motor which drives the rotor blade;
   physical quantity extraction means for extracting two or more physical quantities which are measured during an operation of the vacuum pump, wherein the two or more physical quantities include the temperature of the rotor blade measured by the first sensor and the current amount of the electrical current flowing through the motor measured by the second sensor;
   a time acquisition means for acquiring total time of each of a plurality of stages when the physical quantity belongs to the stage during the operation of the vacuum pump and total time of all of the stages,
      wherein each stage comprises a range of current value as measured by the current amount measurement means, and
      wherein the total time of each stage comprises the total time for which the current value is within the range of current values associated with each stage;
   a storage means for storing the total time of each stage and the total time of all of the stages acquired by the time acquisition means; and
   a control device configured to determine a ratio of the total time of each stage to the total time of all of the stages based on the stored total time of each stage and the total time of all of the stages.

2. The vacuum pump according to claim 1, further comprising:
   a comparison means for comparing the total time of each stage acquired by the time acquisition means with a predetermined threshold; and
   an alarm generation means for issuing an alarm based on a comparison result in the comparison means.

3. The vacuum pump according to claim 1,
   wherein each stage comprises a range of temperatures of the rotor blade as measured by the temperature measurement means, and
   wherein the total time of each stage comprises the total time for which the rotor blade is within the range of temperatures associated with each stage.

4. A control device for a vacuum pump having a rotor blade which is provided in a vacuum pump main body and at least two sensors disposed in the vacuum pump main body and configured to measure physical quantities related to the rotor blade, the control device comprising:
   a physical quantity extraction means for extracting the physical quantities which are measured during an operation of the vacuum pump;

a time acquisition means for acquiring total time of each of a plurality of stages when the physical quantity belongs to the stage during the operation of the vacuum pump and total time of all of the stages,
- wherein each stage comprises a range of current value as measured by the current amount measurement means, and
- wherein the total time of each stage comprises the total time for which the current value is within the range of current values associated with each stage;

a storage means for storing the total time of each stage and the total time of all of the stages which are acquired by the time acquisition means; and wherein the control device is configured to determine a ratio of the total time of each stage to the total time of all of the stages, wherein a first sensor of the at least two sensors is a temperature measurement means for measuring a temperature of the rotor blade and a second sensor of the at least two sensors is a current amount measurement means for measuring a current amount of a current flowing through a motor which drives the rotor blade, and wherein the control device is configured to determine timing of replacement of the rotor blade based on the total time of each stage or the ratio of the total time of each stage to the total time of all of the stages.

5. The control device according to claim 4,
wherein each stage comprises a range of temperatures of the rotor blade as measured by the temperature measurement means, and wherein the total time of each stage comprises the total time for which the rotor blade is within the range of temperatures associated with each stage.

* * * * *